United States Patent
Wu

(10) Patent No.: US 11,316,050 B2
(45) Date of Patent: Apr. 26, 2022

(54) BCE IGZO TFT DEVICE AND MANUFACTURING METHOD THEREOF

(71) Applicant: Shenzhen China Star Optoelectronics Semiconductor Display Technology Co., Ltd., Shenzhen (CN)

(72) Inventor: Wei Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 378 days.

(21) Appl. No.: 16/620,915

(22) PCT Filed: Nov. 15, 2019

(86) PCT No.: PCT/CN2019/118966
§ 371 (c)(1),
(2) Date: Dec. 10, 2019

(87) PCT Pub. No.: WO2021/082094
PCT Pub. Date: May 6, 2021

(65) Prior Publication Data
US 2021/0367077 A1    Nov. 25, 2021

(30) Foreign Application Priority Data
Oct. 29, 2019   (CN) .......................... 201911035653.2

(51) Int. Cl.
*H01L 29/78*   (2006.01)
*H01L 21/02*   (2006.01)
(Continued)

(52) U.S. Cl.
CPC .... *H01L 29/7869* (2013.01); *H01L 21/02565* (2013.01); *H01L 27/127* (2013.01);
(Continued)

(58) Field of Classification Search
CPC ..... H01L 29/24; H01L 29/45; H01L 29/4908; H01L 29/66969; H01L 29/7869;
(Continued)

(56) References Cited

U.S. PATENT DOCUMENTS

2013/0130438 A1   5/2013   Yamazaki et al.
2015/0069378 A1*  3/2015   Cha ....................... H01L 27/127
                                                      438/34

(Continued)

FOREIGN PATENT DOCUMENTS

CN   101740632   6/2010
CN   103219394   7/2013
(Continued)

*Primary Examiner* — Monica D Harrison

(57) ABSTRACT

A BCE IGZO TFT device and a manufacturing method thereof include steps of providing a substrate, depositing a first metal layer on the substrate, wherein the first metal layer forms a gate and a first electrode layer by a patterning process, depositing a gate insulating layer on the substrate, the gate, and the first electrode layer, wherein the gate insulating layer is etched to remove a part of the gate insulating layer on a surface of the first electrode layer, depositing an active layer on the first electrode layer and the gate insulating layer, wherein the active layer and the first electrode layer are in direct contact, and depositing a second metal layer on the active layer, wherein the second metal layer forms a source, a drain, and a second electrode layer by a patterning process.

18 Claims, 3 Drawing Sheets

(51) Int. Cl.
    *H01L 27/12*    (2006.01)
    *H01L 29/786*   (2006.01)
    *H01L 29/24*    (2006.01)
    *H01L 29/45*    (2006.01)
    *H01L 29/49*    (2006.01)
    *H01L 29/66*    (2006.01)

(52) U.S. Cl.
    CPC ...... *H01L 27/1218* (2013.01); *H01L 27/1225* (2013.01); *H01L 29/24* (2013.01); *H01L 29/45* (2013.01); *H01L 29/4908* (2013.01); *H01L 29/66969* (2013.01); *H01L 29/78696* (2013.01)

(58) Field of Classification Search
    CPC ........... H01L 29/78696; H01L 27/1218; H01L 27/1225; H01L 27/127; H01L 21/02565
    USPC .......................................................... 257/43
    See application file for complete search history.

(56)           References Cited

U.S. PATENT DOCUMENTS

2017/0025448 A1     1/2017  Koyama et al.
    2020/0027938 A1*    1/2020  Song ................... H01L 27/1251
    2020/0091202 A1     3/2020  Yamazaki et al.

FOREIGN PATENT DOCUMENTS

CN          103400838       11/2013
    CN          103779427        5/2014
    CN          108780797       11/2018

* cited by examiner

BCE IGZO TFT DEVICE AND MANUFACTURING METHOD THEREOF

RELATED APPLICATIONS

This application is a National Phase of PCT Patent Application No. PCT/CN2019/118966 having International filing date of Nov. 15, 2019, which claims the benefit of priority of Chinese Patent Application No. 201911035653.2 filed on Oct. 29, 2019. The contents of the above applications are all incorporated by reference as if fully set forth herein in their entirety.

FIELD AND BACKGROUND OF THE INVENTION

The disclosure relates to the display technical field, and more particularly, to a BCE IGZO TFT device and a manufacturing method thereof.

As the development of display panels advances toward large size, high resolution, and high frequency, thin film transistors (TFT) and display panels thereof receive more and more attention from the industry, wherein indium gallium zinc oxide (IGZO), a high mobile active layer material, is widely used in the industry. Currently, in various structure of IGZO panels, IGZO materials are susceptible to hydrogen doping, producing lots of charge carrier and then becoming conductors, leading to a loss of semiconductor properties. Therefore, in a manufacturing process of IGZO TFT devices, it is necessary to replace the most common silicon nitride insulating layer with an oxide insulating layer such as silicon oxide and alumina to be in contact with semiconductor layers in a production of amorphous silicon thin film transistors.

At present, the most commonly used IGZO TFT array substrates in the industry are back channel etch (BCE) IGZO TFT. A commonly used gate insulating layer and protective layer are respectively a bilayer film of silicon nitride (lower) and silicon oxide (upper) and a bilayer film of silicon oxide (lower) and silicon nitride (upper). Due to the film layer structure thereof, it is difficult to etch the gate insulating layer and the protective layer. Therefore, a gate insulating layer (gate insulating, GI) mask is added in the manufacturing process of BCE IGZO TFT array substrates to facilitate the bonding of a first metal layer and a second metal layer.

However, in this way, after introducing the second metal layer half-tone technology, IGZO cannot be etched in the dry etching process of the gate insulating layer, and IGZO tail is produced, thereby causing a first electrode layer and a second electrode layer are abnormally overlapped, which affects the quality of the IGZO TFT array substrate.

Thus, there is a need to provide a BCE IGZO TFT device and a manufacturing method thereof to resolve problems of the prior art.

SUMMARY OF THE INVENTION

A gate insulating layer mask is added in the manufacturing process of the BCE IGZO TFT array substrates to facilitate the bonding of a first metal layer and a second metal layer. However, in this way, after pouring the second metal layer half-tone technology, IGZO cannot be etched during the dry etching process of the gate insulating layer, and IGZO tail is produced, thereby causing a first electrode layer and a second electrode layer are abnormally overlapped, which affects a quality of the IGZO TFT array substrate.

To resolve the above technical problems, the present disclosure provides a BCE IGZO TFT device and a manufacturing method thereof. According to one embodiment of the present disclosure, a manufacturing method of BCE IGZO TFT device comprises steps of providing a substrate, depositing a first metal layer on the substrate, and the first metal layer forming a gate and a first electrode layer by a patterning process, depositing a gate insulating layer on the substrate, the gate, and the first electrode layer, etching a part of the gate insulating layer on a surface of the first electrode layer, depositing an active layer on the first electrode layer and the gate insulating layer, and the active later and the first electrode layer in direct contact, and depositing a second metal layer on the active layer, and the second metal layer forming a source, a drain, and a second electrode layer by a patterning process.

According to one aspect of the present disclosure, the substrate is a glass substrate or a polyimide flexible substrate, and a thickness of the substrate ranges from 0.01 mm to 10 mm.

According to one aspect of the present disclosure, the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

According to one aspect of the present disclosure, the active layer is IGZO, and a thickness of the active layer ranges from 5 nm to 200 nm.

According to one aspect of the present disclosure, the gate and the first electrode layer are metal such as Cu, Al, Mo, Nb, Ti or an alloy thereof, or a multilayer film structure composed of the metal, and a thickness of the gate and the first electrode layer ranges from 10 nm to 1000 nm.

According to one aspect of the present disclosure, the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

According to one embodiment of the present disclosure, a manufacturing method of BCE IGZO TFT device comprises steps of providing a substrate, depositing a first metal layer on the substrate, and the first metal layer forming a gate and a first electrode layer by a patterning process, depositing a gate insulating layer on the substrate, the gate, and the first electrode layer, etching a part of the gate insulating layer on a surface of the first electrode layer, disposing an active layer on the first electrode layer and the gate insulating layer without performing an etching process, and the active later and the first electrode layer in direct contact, and depositing a second metal layer on the active layer, and the second metal layer forming a source, a drain, and a second electrode layer by a patterning process.

According to one aspect of the present disclosure, the substrate is a glass substrate or a polyimide flexible substrate, and a thickness of the substrate ranges from 0.01 mm to 10 mm.

According to one aspect of the present disclosure, the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

According to one aspect of the present disclosure, the active layer is IGZO, and a thickness of the active layer ranges from 5 nm to 200 nm.

According to one aspect of the present disclosure, the gate and the first electrode layer are metal such as Cu, Al, Mo, Nb, Ti or an alloy thereof, or a multilayer film structure composed of the metal, and a thickness of the gate and the first electrode layer is 10 to 1000 nm.

According to one aspect of the present disclosure, the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

According to one embodiment of the present disclosure, a BCE IGZO TGT device comprises a substrate, a gate disposed on the substrate, a first electrode layer disposed on the substrate, a gate insulating layer disposed on the substrate, the gate, and the first electrode layer, an active layer disposed on the first electrode layer and the gate insulating, and the active layer and the first electrode layer in direct contact, a source disposed on the active layer, a drain disposed on the active layer, and a second electrode layer disposed on the active layer.

According to one aspect of the present disclosure, the substrate is a glass substrate or a polyimide flexible substrate, and a thickness of the substrate ranges from 0.01 mm to 10 mm.

According to one aspect of the present disclosure, the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

According to one aspect of the present disclosure, the active layer is IGZO, and a thickness of the active layer ranges from 5 nm to 200 nm.

According to one aspect of the present disclosure, the gate and the first electrode layer are metal such as Cu, Al, Mo, Nb, Ti or an alloy thereof, or a multilayer film structure composed of the metal, and a thickness of the gate and the first electrode layer ranges from 10 nm to 1000 nm.

According to one aspect of the present disclosure, the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

The present disclosure provides a BCE IGZO TFT device and a manufacturing method thereof, which achieves a transfer between a first electrode layer and a second electrode layer in the IGZO TFT array substrate by bonding the first electrode layer, IGZO, and the second electrode layer without performing an etching process, which prevents the IGZO Tail problem when transferring the first electrode layer and the second electrode layer after introducing the second metal layer half-tone technology.

Furthermore, the present disclosure improves the transfer between a first electrode layer and a second electrode layer in the IGZO TFT array substrate and product yield, and reduces the number of processes and production costs.

DESCRIPTION OF SPECIFIC EMBODIMENTS OF THE INVENTION

Figure 1A:
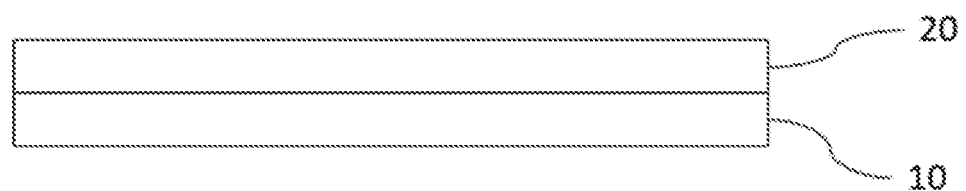
FIG. 1(a) to FIG. 1(b) are flowchart diagrams of a first electrode layer of the present disclosure.
Figure 1B:
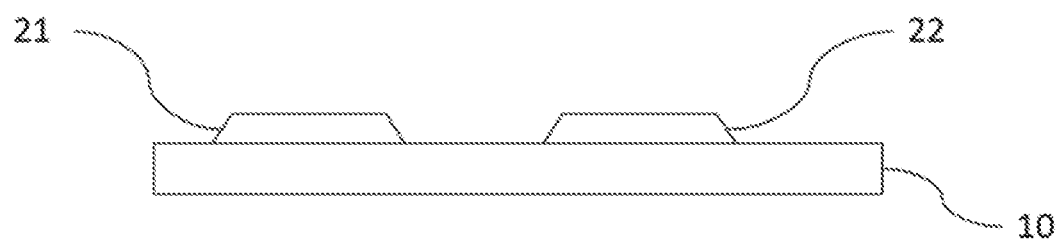

In an embodiment, a manufacturing method of BCE IGZO TFT device, is as shown in FIG. 1(a) and FIG. 1(b). A first metal layer 20 sequentially deposits Mo and Cu metal layers on a substrate 10 by magnetron sputtering, a photoresist layer is coated on the first metal layer 20, and the photoresist layer performs exposing, development, etching, stripping the photoresist layer to form a gate 21 and a first electrode layer 22.

Figure 2A:
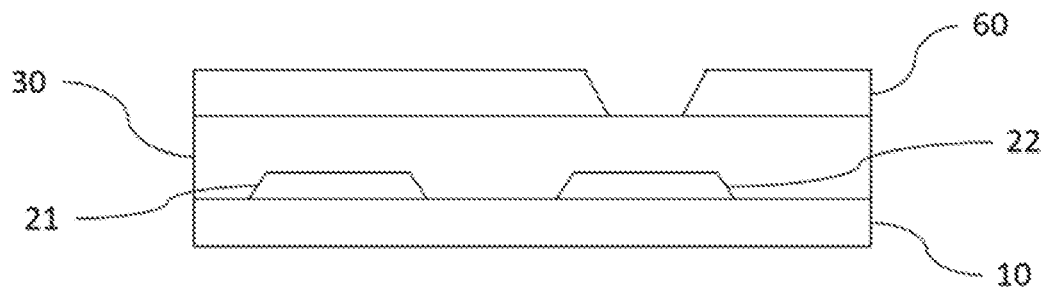
FIGS. 2(a), 2(b) and 2(c) are etching flowchart diagrams of a gate insulating layer of the present disclosure.
Figure 2B:
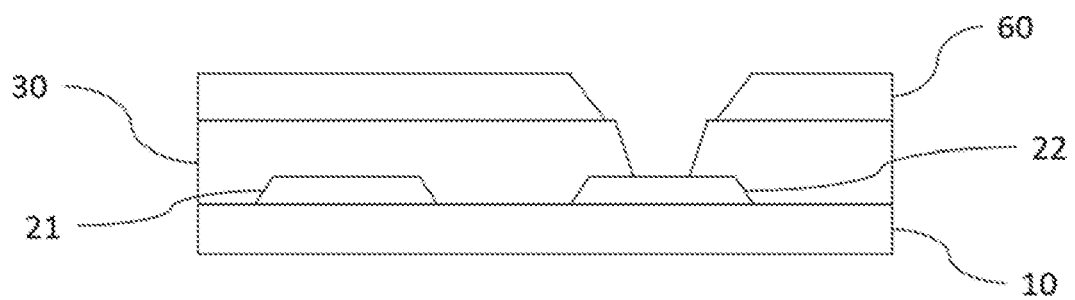
Figure 2C:
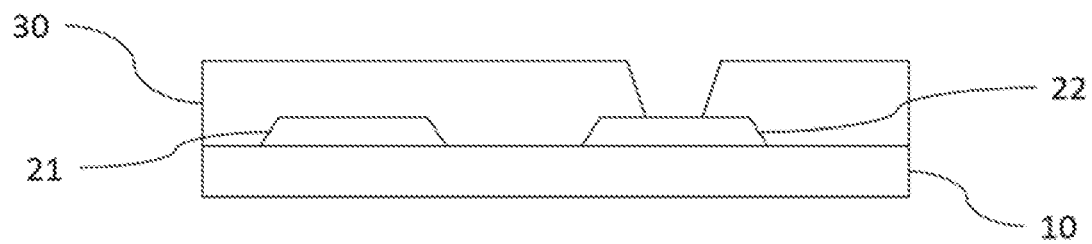

Further, as shown in FIG. 2(a), a gate insulating layer 30 sequentially deposits silicon nitride and silicon oxide on the substrate 10, the gate electrode 21, and the first electrode layer 22 by chemical vapor deposition, a photoresist layer 60 is coated on the gate insulating layer 30, and the photoresist layer performs exposing, development, etching. Further, as shown in FIG. 2(b) and FIG. 2(c), the gate insulating layer 30 is etched to remove a part of the gate insulating layer 30 on a surface of the first electrode layer 22, and the photoresist layer 60 is removed to form a design pattern.

Figure 3:
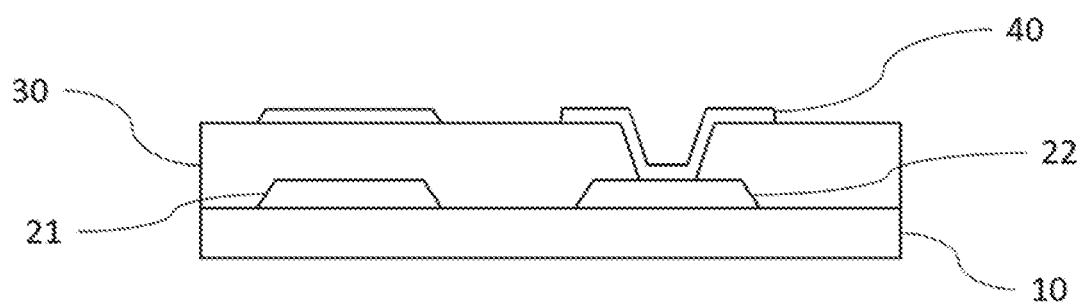
FIG. 3 is a schematic structural diagram of an active layer of the present disclosure.

Further, as shown in FIG. 3, an active layer 40 is deposited on the first electrode layer 22 and the gate insulating layer 30 by magnetron sputtering, and the active layer 40 and the first electrode layer 22 are in direct contact.

Figure 4A:
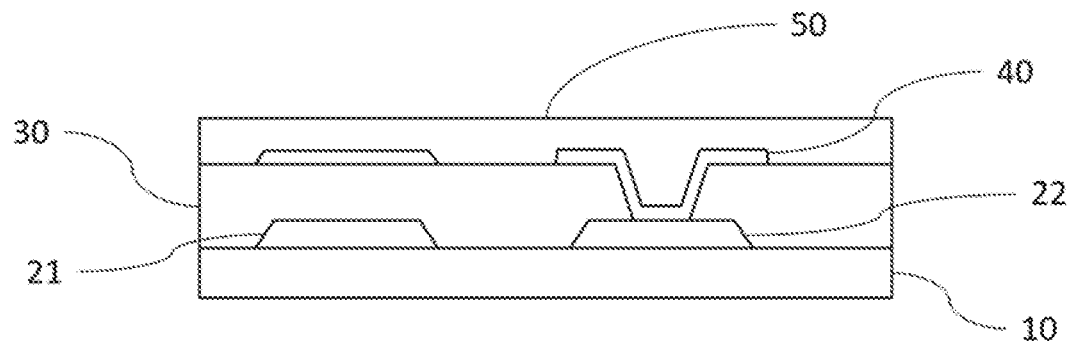
FIG. 4(a) to FIG. 4(b) are flowchart diagrams of a second electrode layer of the present disclosure.
Figure 4B:
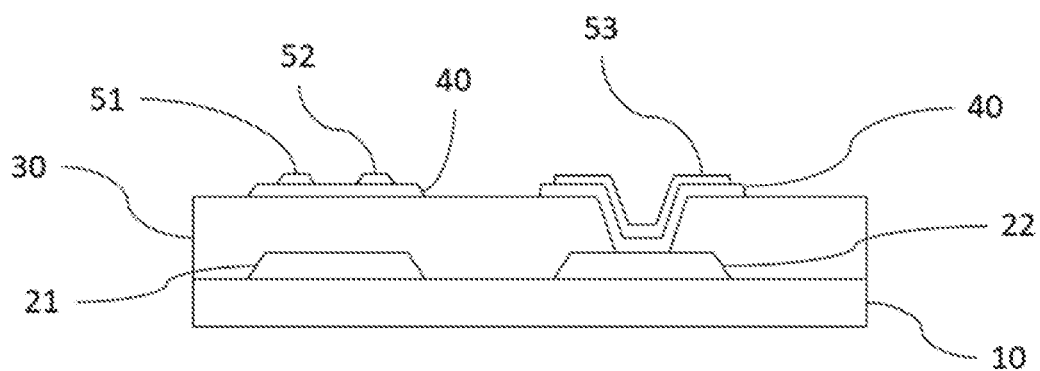

Further, as shown in FIG. 4(a) and FIG. 4(b), a second metal layer 50 sequentially deposits Mo and Cu metal layers on the active later 40 by magnetron sputtering, a photoresist layer is coated, and the photoresist layer performs exposing, development, etching, stripping the photoresist layer to form a source 51, a drain 52, and a second electrode layer 53.

In one embodiment, the substrate 10 is a glass substrate or a polyimide flexible substrate, and a thickness of the substrate ranges from 0.01 mm to 10 mm.

In one embodiment, the gate insulating layer 30 is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

In one embodiment, the active layer 40 is IGZO, and a thickness of the active layer ranges from 5 nm to 200 nm.

In one embodiment, the gate 21 and the first electrode layer 22 are metal such as Cu, Al, Mo, Nb, Ti or an alloy thereof, or a multilayer film structure composed of the metal, and a thickness of the gate and the first electrode layer ranges from 10 nm to 1000 nm.

In one embodiment, the source 51, the drain 52, and the second electrode layer 53 metal such as Cu, Al, Mo, Nb, Ti or an alloy thereof, or a multilayer film structure composed of the metal, and a thickness of the source, the drain, and the second electrode layer ranges from 10 nm to 1000 nm.

In an embodiment, a manufacturing method of BCE IGZO TFT device, is as shown in FIG. 1(a) and FIG. 1(b). A first metal layer 20 sequentially deposits Mo and Cu metal layers on a substrate 10 by magnetron sputtering, a photoresist layer is coated on the first metal layer 20, and the photoresist layer performs exposing, development, etching, stripping the photoresist layer to form a gate 21 and a first electrode layer 22.

Further, as shown in FIG. 2(a), a gate insulating layer 30 sequentially deposits silicon nitride and silicon oxide on the substrate 10, the gate electrode 21, and the first electrode layer 22 by chemical vapor deposition, a photoresist layer 60 is coated on the gate insulating layer 30, and the photoresist layer performs exposing, development, etching. Further, as shown in FIG. 2(b) and FIG. 2(c), the gate insulating layer 30 performs etching to remove a part of the gate insulating layer 30 on a surface of the first electrode layer 22, and the photoresist layer 60 is removed to form a design pattern.

Further, as shown in FIG. 3, an active layer 40 is disposed on the first electrode layer 22 and the gate insulating layer 30 without performing etching process, and the active layer 40 and the first electrode layer 22 are in direct contact.

Further, as shown in FIG. 4(a) and FIG. 4(b), a second metal layer 50 sequentially deposits Mo and Cu metal layers on the active later 40 by magnetron sputtering, a photoresist layer is coated, and the photoresist layer performs exposing, development, etching, stripping the photoresist layer to form a source 51, a drain 52, and a second electrode layer 53.

In one embodiment, the substrate 10 is a glass substrate or a polyimide flexible substrate, and a thickness of the substrate ranges from 0.01 mm to 10 mm.

In one embodiment, the gate insulating layer 30 is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

In one embodiment, the active layer 40 is IGZO, and a thickness of the active layer ranges from 5 nm to 200 nm.

In one embodiment, the gate 21 and the first electrode layer 22 are metal such as Cu, Al, Mo, Nb, Ti or an alloy thereof, or a multilayer film structure composed of the metal, and a thickness of the gate and the first electrode layer ranges from 10 nm to 1000 nm.

In one embodiment, the source 51, the drain 52, and the second electrode layer 53 are metal such as Cu, Al, Mo, Nb, Ti or an alloy thereof, or a multilayer film structure composed of the metal, and a thickness of the source, the drain, and the second electrode layer ranges from 10 nm to 1000 nm.

In one embodiment, as shown in FIG. 4(b), a BCE IGZO TGT device comprises a substrate 10, a gate 21 disposed on the substrate 10, a first electrode layer 22 disposed on the substrate 10, a gate insulating layer 30 disposed on the substrate 10, the gate 21, and the first electrode layer 22, an active layer 40 disposed on the first electrode layer 22 and the gate insulating 30, wherein the active layer 40 and the first electrode layer 22 in direct contact, a source 51 disposed on the active layer 40, a drain 52 disposed on the active layer 40, and a second electrode 53 layer disposed on the active layer 40.

In one embodiment, the substrate 10 is a glass substrate or a polyimide flexible substrate, and a thickness of the substrate ranges from 0.01 mm to 10 mm.

In one embodiment, the gate insulating layer 30 is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

In one embodiment, the active layer 40 is IGZO, and a thickness of the active layer ranges from 5 nm to 200 nm.

In one embodiment, the gate 21 and the first electrode layer 22 are metal such as Cu, Al, Mo, Nb, Ti or an alloy thereof, or a multilayer film structure composed of the metal, and a thickness of the gate and the first electrode layer ranges from 10 nm to 1000 nm.

In one embodiment, the source 51, the drain 52, and the second electrode layer 53 are metal such as Cu, Al, Mo, Nb, Ti or an alloy thereof, or a multilayer film structure composed of the metal, and a thickness of the source, the drain, and the second electrode layer ranges from 10 nm to 1000 nm.

In one embodiment, the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

The present embodiment provides a BCE IGZO TFT device and a manufacturing method thereof, which achieves a transfer between a first electrode layer and a second electrode layer in the IGZO TFT array substrate by bonding the first electrode layer, IGZO, and the second electrode layer. A deposition of the second electrode layer transforms IGZO under the second electrode layer into a conductor without performing an etching process, which resolves the IGZO Tail problem when transferring the first electrode layer and the second electrode layer after introducing the second metal layer half-tone technology.

Although the present invention has been described with reference to the preferred embodiments thereof, it is noted that the person having ordinary skill in the art may appreciate improvements and modifications without departing from the principle of the present invention and those improvements and modifications are considered within the scope of protection of the present invention.

What is claimed is:

1. A manufacturing method of a back channel etching indium gallium zinc oxide thin film transistor (BCE IGZO TFT) device, comprising:
   providing a substrate;
   depositing a first metal layer on the substrate, and the first metal layer forming a gate and a first electrode layer by a patterning process;
   depositing a gate insulating layer on the substrate, the gate, and the first electrode layer;
   etching a part of the gate insulating layer on a surface of the first electrode layer;
   depositing an active layer on the first electrode layer and the gate insulating layer, and the active later and the first electrode layer in direct contact; and
   depositing a second metal layer on the active layer, and the second metal layer forming a source, a drain, and a second electrode layer by a patterning process.

2. The manufacturing method of the BCE IGZO TFT device as claimed in claim 1, wherein the substrate is a glass substrate or a polyimide flexible substrate, and a thickness of the substrate ranges from 0.01 mm to 10 mm.

3. The manufacturing method of the BCE IGZO TFT device as claimed in claim 1, wherein the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

4. The manufacturing method of the BCE IGZO TFT device as claimed in claim 1, wherein the active layer is IGZO, and a thickness of the active layer ranges from 5 nm to 200 nm.

5. The manufacturing method of the BCE IGZO TFT device as claimed in claim 4, wherein the gate and the first electrode layer are metal such as Cu, Al, Mo, Nb, Ti or an alloy thereof, or a multilayer film structure composed of the metal, and a thickness of the gate and the first electrode layer is 10 to 1000 nm.

6. The manufacturing method of the BCE IGZO TFT device as claimed in claim 1, wherein the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

7. A manufacturing method of a back channel etching indium gallium zinc oxide thin film transistor (BCE IGZO TFT) device, comprising:
   providing a substrate;
   depositing a first metal layer on the substrate, and the first metal layer forming a gate and a first electrode layer by a patterning process;
   depositing a gate insulating layer on the substrate, the gate, and the first electrode layer;
   etching a part of the gate insulating layer on a surface of the first electrode layer;
   disposing an active layer on the first electrode layer and the gate insulating layer without performing etching process, and the active later and the first electrode layer in direct contact; and
   depositing a second metal layer on the active layer, and the second metal layer forming a source, a drain, and a second electrode layer by a patterning process.

8. The manufacturing method of the BCE IGZO TFT device as claimed in claim 7, wherein the substrate is a glass substrate or a polyimide flexible substrate, and a thickness of the substrate ranges from 0.01 mm to 10 mm.

9. The manufacturing method of the BCE IGZO TFT device as claimed in claim 7, wherein the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

10. The manufacturing method of the BCE IGZO TFT device as claimed in claim 7, wherein the active layer is IGZO, and a thickness of the active layer ranges from 5 nm to 200 nm.

11. The manufacturing method of the BCE IGZO TFT device as claimed in claim 7, wherein the gate and the first electrode layer are metal such as Cu, Al, Mo, Nb, Ti or an alloy thereof, or a multilayer film structure composed of the metal, and a thickness of the gate and the first electrode layer ranges from 10 nm to 1000 nm.

12. The manufacturing method of the BCE IGZO TFT device as claimed in claim 7, wherein the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

13. A back channel etching indium gallium zinc oxide thin film transistor (BCE IGZO TFT) device, comprising:
   a substrate;
   a gate disposed on the substrate;
   a first electrode layer disposed on the substrate;
   a gate insulating layer disposed on the substrate, the gate, and the first electrode layer;
   an active layer disposed on the first electrode layer and the gate insulating, and the active layer and the first electrode layer in direct contact;
   a source disposed on the active layer;
   a drain disposed on the active layer; and
   a second electrode layer disposed on the active layer.

14. The BCE IGZO TFT device as claimed in claim 13, wherein the substrate is a glass substrate or a polyimide flexible substrate, and a thickness of the substrate ranges from 0.01 mm to 10 mm.

15. The BCE IGZO TFT device as claimed in claim 13, wherein the gate insulating layer is a multilayer film structure composed of one or more of silicon nitride, silicon oxide, silicon oxynitride, aluminum oxide, or yttrium oxide insulating compound, and a thickness of the gate insulating layer ranges from 10 nm to 1000 nm.

16. The BCE IGZO TFT device as claimed in claim 13, wherein the active layer is IGZO, and a thickness of the active layer ranges from 5 nm to 200 nm.

17. The BCE IGZO TFT device as claimed in claim 13, wherein the gate and the first electrode layer are metal such as Cu, Al, Mo, Nb, Ti or an alloy thereof, or a multilayer film structure composed of the metal, and a thickness of the gate and the first electrode layer ranges from 10 nm to 1000 nm.

18. The BCE IGZO TFT device as claimed in claim 13, wherein the source, the drain, and the second electrode layer are metal such as Cu, Al, Mo, Nb, Ti or an alloy thereof, or a multilayer film structure composed of the metal, and a thickness of the source, the drain, and the second electrode layer ranges from 10 nm to 1000 nm.

* * * * *